United States Patent
Arsikere et al.

(10) Patent No.: US 6,424,653 B1
(45) Date of Patent: Jul. 23, 2002

(54) POINT-TO-POINT LINK IMPLEMENTED OVER A BROADCAST NETWORK

(75) Inventors: Amarnath R. Arsikere, Glenview; Joseph P. Bologna, Spring Grove; Philip A. Anast, Mt. Prospect, all of IL (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/188,605

(22) Filed: Nov. 9, 1998

(51) Int. Cl.[7] .......................... H04L 12/28; G06F 15/16; H04J 3/16

(52) U.S. Cl. ..................... 370/401; 370/467; 709/220; 709/227; 709/231

(58) Field of Search ................................ 370/245, 252, 370/352, 397, 399, 400, 401, 467, 405, 389; 709/230, 249, 231, 220, 221, 227; 710/9, 10

(56) References Cited

U.S. PATENT DOCUMENTS

| | | | |
|---|---|---|---|
| 5,086,426 A | * | 2/1992 | Tsukakoshi et al. ........ 709/249 |
| 5,420,916 A | * | 5/1995 | Sekiguchi ................... 370/405 |
| 5,809,028 A | * | 9/1998 | Nethercott .................. 370/467 |

FOREIGN PATENT DOCUMENTS

| | | | |
|---|---|---|---|
| WO | 94/23515 A | 10/1994 | ........... H04L/12/28 |
| WO | 95/27379 A | 10/1995 | ........... H04Q/1/14 |
| WO | 97/50209 A | 12/1997 | ........... H04L/12/24 |

OTHER PUBLICATIONS

Koizumi M. et al.: "DCNP: Data Communication Management System for Network Node Processors in a Distributed Processing Environment," Proceedings of the Global Telecommunications Conference, US, New York, IEEE, pp. 1219–1223.

James D. Solomon, Mobile IP The Internet Uplugged, 1996, pp. 234–245.

* cited by examiner

Primary Examiner—Alpus H. Hsu
Assistant Examiner—Afsar M. Qureshi
(74) Attorney, Agent, or Firm—Teradyne Legal Dept.

(57) ABSTRACT

A telecommunication test network including both a broadcast network and a point-to-point network is disclosed. The test network includes a programmable test system controller coupled to the broadcast network, a plurality of remote measurement units coupled to the point-to-point network, and a gateway computer linking the broadcast and point-to-point networks. The test system controller is programmed to establish communication channels with the remote measurement units, thereby enabling the test system controller to control the remote units and to analyze parameters measured by the remote units. These communication channels are established using standard protocols and without requiring custom programming in the gateway computer.

19 Claims, 7 Drawing Sheets

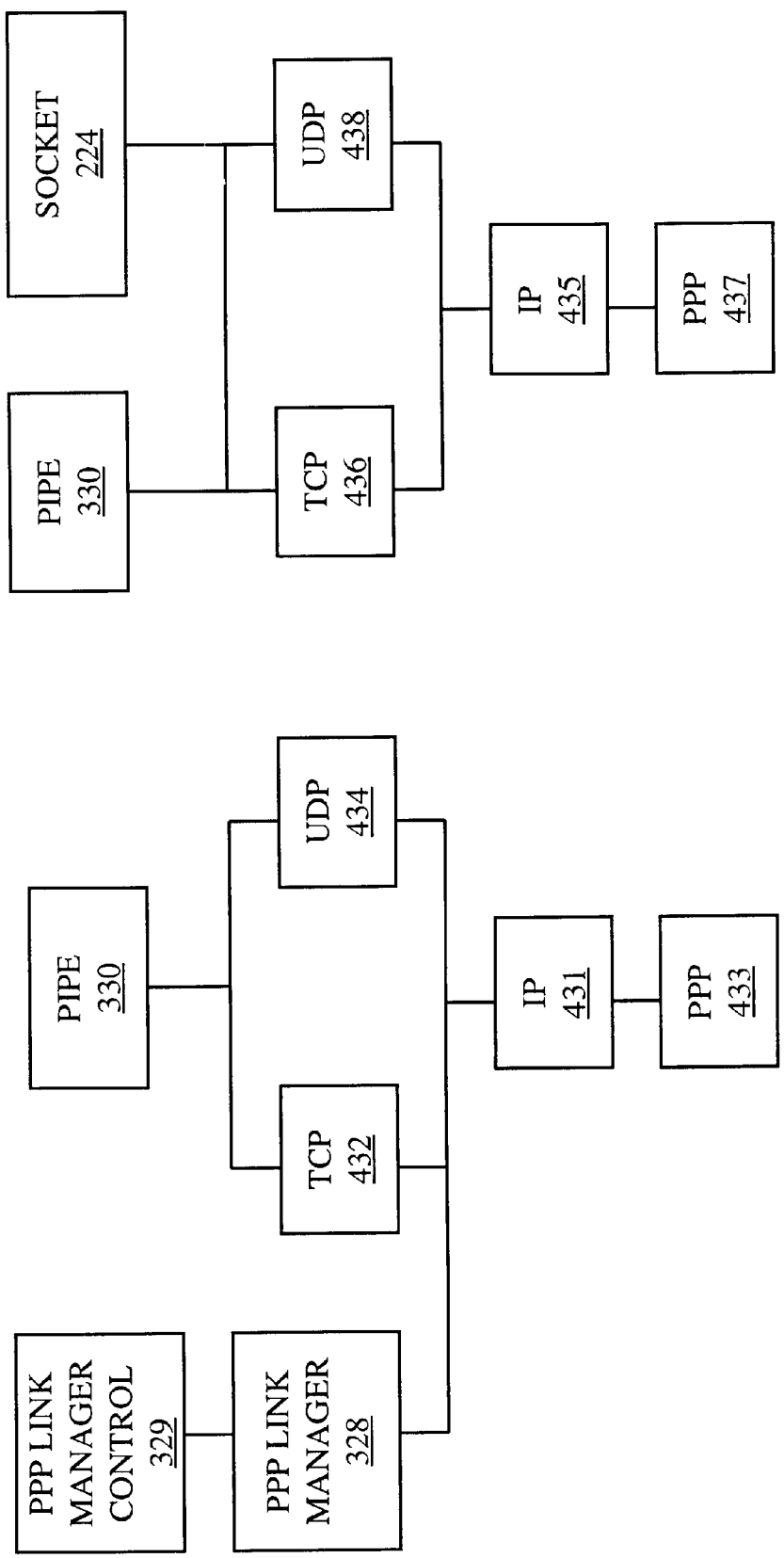

POINT-TO-POINT LINK IMPLEMENTED OVER A BROADCAST NETWORK

This invention relates generally to communications over computer networks, and more specifically to communications between components of computerized test systems over a network.

Computers and computerized devices are frequently used in networked configurations. Networks allow multiple users, each with a separate computer, to share information and hardware resources such as mass storage systems, printers, and fax machines.

Typical office environments are set up with computers connected to local area networks (LAN's), which allow relatively small numbers of computers or computerized devices in limited areas to exchange information. Generally, computers connected to a LAN belong to users within one work group.

Many companies have offices in different buildings or multiple work groups in the same building. These companies generally use wide area networks (WAN's) to network their computers. Such WAN's are often implemented by linking together multiple LAN's.

Several elements define a network. One element is the physical medium, which is the actual connection that allows information to pass from one computer to another. The physical medium is often one or more cables. However, the physical medium could also be a radio or infrared link or any other connection that allows a stream of bits to be communicated between computerized devices.

In addition to a physical medium, every network requires one or more protocols. Generally, a protocol is a set of rules that all computers and computerized devices on a network use to interpret packets of information that pass through the network. For example, a protocol might specify when it is appropriate for a particular computer to send a packet of information. The protocol might also specify the format of a packet of information. For example, it might include a way of identifying the end of a packet and a way of identifying which computer in the network is intended to receive the packet. At a higher level, the protocol might also specify a way of identifying which packets of information are logically grouped into one transmission.

LAN's typically have a physical medium in which all computers and computerized devices on the LAN are interconnected. A protocol corresponding to this physical medium is typically a "broadcast" protocol, which means that each packet is sent to every computer. Such a network is therefore commonly called a broadcast network. Each packet that is sent through a broadcast network typically contains information allowing each computer or computerized device on the network to recognize whether the packet is intended for that device. Ethernet and token ring are two examples of widely used broadcast protocols.

WAN's typically have a physical medium that provides a direct connection between each pair of computers or computerized devices that must communicate. A protocol corresponding to this physical medium is typically a "point-to-point" protocol. Such a network is therefore commonly called a point-to-point network. Public switched telephone networks (PSTN) and X.25 networks are two examples of WAN's that use point-to-point protocols.

Because the number of cables required to connect each pair of computers in a point-to-point network is often prohibitive, multiple computers in a point-to-point network are usually connected to a central computer. This central computer may be in a LAN. In that case, a device called a "terminal server" is typically used to connect the multiple computers in the point-to-point network to the central computer in the LAN.

A terminal server typically has multiple I/O ports and a computerized switch, which may be used to connect each port to the LAN. Similarly, multiple computers or computerized devices in the point-to-point network can be connected to the ports of the terminal server. Because terminal servers can be used to link LAN's with point-to-point networks, they are often referred to as a "gateways."

In order to send information from a computer in a LAN to a computer in a point-to-point network, the LAN and the point-to-point network must generally be linked by a gateway. Further, the gateway must generally be capable of establishing a point-to-point connection with the computer in the point-to-point network. For example, a computer in the LAN may send a packet over the LAN to the gateway. Part of the packet indicates which computer in the point-to-point network is to receive the information contained in the packet, while the rest of the packet contains the information. If the gateway has the capability of establishing a point-to-point connection, then the gateway might first translate the packet from the broadcast protocol used by the LAN to the point-to-point protocol used by the point-to-point network, establish the point-to-point connection, and then send the translated packet to the indicated computer in the point-to-point network.

Data sent from a computer in a point-to-point network to a computer in a LAN generally goes through a reverse process. For example, the computer sends a packet using the point-to-point protocol to the gateway. The packet must include sufficient information to allow the gateway to create a packet that can be broadcast over the LAN to the intended computer. The gateway then broadcasts the packet using the required protocol over the LAN.

We have recognized that this type of network architecture may be used in telecommunication test networks. In that case, multiple computers and computerized devices in a point-to-point network may be connected to a central computer in a LAN through telephone lines and a gateway. In particular, the point-to-point network may be a PSTN; the computerized devices in the point-to-point network may be remote measurement units (MU); and, the central computer in the LAN may be a test system controller (TSC). Further, each I/O port in the gateway and each remote measurement unit may be connectable to the PSTN through modems.

However, we have also recognized some shortcomings in such test network architectures. First, in order for the telecommunication test network to work properly, there must be some way of initiating point-to-point connections between the test system controller and the remote measurement units. But, gateways like the terminal servers described above often do not have this capability. Further, because these gateways are typically legacy systems, they are not easily upgraded to provide such capabilities.

Even if the gateway in the telecommunication test network were capable of establishing point-to-point connections with the remote measurement units, it might do so in a non-standard manner. For example, computers and computerized devices on a computer network generally operate using standard protocols. The broadcast protocol and the point-to-point protocol mentioned above are two examples of standard protocols, which are typically based upon the Open Systems Interconnection (OSI) model. This is a widely accepted framework of standards for communicating between different computers made by different manufacturers. Test system controllers and remote measurement units that operate using standard protocols can therefore easily communicate with other devices on the LAN and the PSTN, respectively, so long as the other devices are also made to use standard protocols.

Further, one way for the test system controller to communicate with the remote measurement units is to have the gateway linking the LAN and the PSTN make translations between broadcast and point-to-point protocols.

However, there are currently no accepted standards for making such protocol translations. This is a problem in telecommunication test networks because different telephone companies typically use different network equipment. This means that gateways linking LAN's and WAN's of different telephone companies may use different custom software for making such protocol translations or otherwise establishing communications between components on the LAN's and WAN's. Consequently, the test system controllers and remote measurement units that communicate with these different gateways may also require non-standard, custom software. Having customized test system software for different network configurations makes it very expensive to install and maintain test system equipment.

It would therefore be desirable to have a test system that can use existing networks including both a LAN and a WAN. Such a test system would be capable of establishing communications between test system components in the LAN and in the WAN using accepted communication standards. It would also be desirable to achieve this without requiring custom software changes in the networks.

SUMMARY OF THE INVENTION

With the foregoing background in mind, it is an object of the invention to provide computer equipment that can be easily incorporated into a network operating with standard protocols.

Another object of the invention is to provide a test system that can be easily integrated into existing telecommunication networks.

The foregoing and other objects are achieved by providing a test system including a first peer in a LAN and at least one second peer in a WAN, wherein the LAN and the WAN are linked by a gateway.

In a preferred embodiment, the first peer is a client and the gateway is a terminal server. The client is programmed for establishing a virtual pipe with the terminal server, and passing the virtual pipe to a client link manager. This allows the client link manager to negotiate a point-to-point connection between the first peer and the second peer.

According to one feature the first peer, the terminal server, and the second peer operate under the control of a UNIX® operating system.

Still further objects and advantages will become apparent from a consideration of the ensuing description and drawings.

BRIEF DESCRIPTION OF THE DRAWINGS

The invention will be better understood by reference to the following more detailed description and accompanying drawings in which

FIGS. 4A through 4C are simplified block diagrams showing relationships between various protocols used in the invention;

DESCRIPTION OF THE PREFERRED EMBODIMENT

Figure 1:
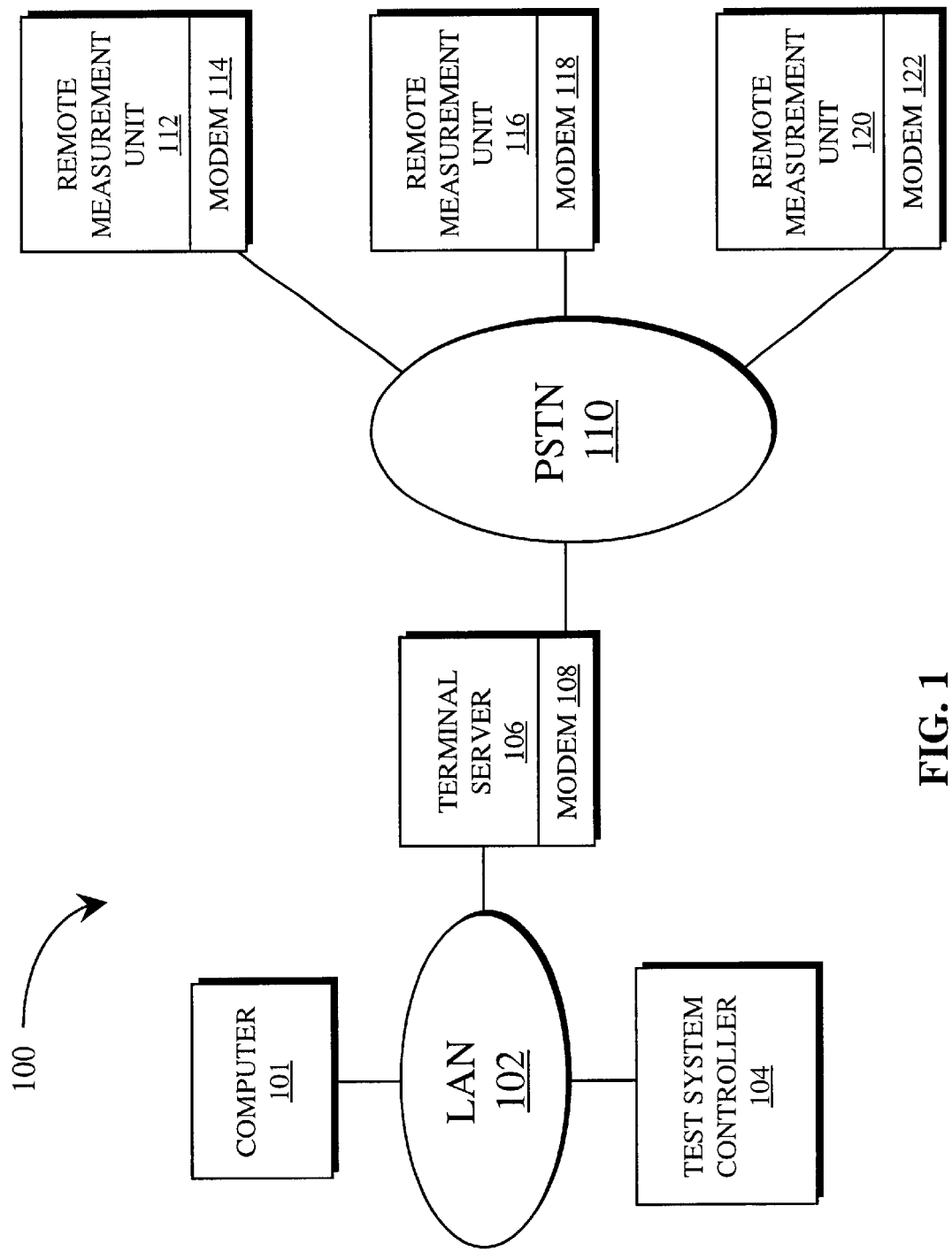
FIG. 1 is a block diagram of a telecommunication network incorporating components of a test system according to the invention.

FIG. 1 shows telecommunication test network 100, which may be used to detect and locate faults in a telephone network. The test network 100 includes a public switched telephone network (PSTN) 110 and a plurality of remote measurement units (MU) such as the MU's 112, 116, and 120. In order for the MU's 112, 116, and 120 to make connections with telephone lines in the PSTN 110, the MU's 112, 116, and 120 include associated modems 114, 118, and 122, respectively.

The MU's 112, 116, and 120 are used for detecting and locating faults in the PSTN 110. It is known to those skilled in this art that a PSTN generally includes trunk lines (not shown), subscriber lines (not shown), and switches (not shown) that connect the trunk lines to the subscriber lines for establishing telephone call connections. These call connections are typically established using conventional point-to-point links. Further, trunk line and switch pairs are generally located in a plurality of central offices (not shown) distributed throughout the PSTN.

The MU's 112, 116, and 120 can be used to measure various parameters of selected subscriber lines. For example, the MU's 112, 116, and 120 may measure voltage, current, resistance, impedance, capacitance, inductance, frequencies of tones on the lines, and charge stored on the lines. The MU's 112, 116, and 120 may also generate pulses and capture resulting signals on the lines. The MU's 112, 116, and 120 are therefore preferably located in respective central offices in the PSTN 110 where they are coupled to switches that connect them to the selected subscriber lines, thereby allowing them to make desired measurements on the lines.

The test network 100 also includes a local area network (LAN) 102, which interconnects a computer 101, a terminal server 106, and a test system controller (TSC) 104. The LAN 102 may use a conventional multi-access channel ("broadcast" protocol) such as Ethernet or token ring. Further, in order for the terminal server 106 to make connections with telephone lines in the PSTN 110, the terminal server 106 also has an associated modem 108.

The TSC 104 is used for controlling the MU's 112, 116, and 120 and for analyzing data collected by the MU's 112, 116, and 120. The TSC 104 therefore sends commands to the MU's 112, 116, and 120 and receives measurement data back from the MU's 112, 116, and 120 through the terminal server 106 and the telephone lines in the PSTN 110. The TSC 104 then processes the data to detect and locate faults in the telephone network and reports test results to a human operator, who may dispatch personnel to repair the faults.

The TSC 104, the terminal server 106, the computer 101, and the LAN 102 are normally located in a telephone company technical service center (not shown). As mentioned above, office environments are traditionally set up with computers connected to a LAN, thereby allowing computer users to exchange information and share resources such as mass storage devices, printers, and fax machines. Accordingly, a plurality of computers including the computer 101 and the test system controller 104 are connected to the LAN 102 in the technical service center, thereby allowing them to exchange data and share resources.

Detailed information about the preferred structure and general operation of the TSC 104 and the MU's 112, 116, and 120 may be obtained from U.S. Pat. No. 5,699,402 assigned to TERADYNE®, Inc., Deerfield, Ill., USA, which is fully incorporated herein by reference.

It was mentioned that the LAN 102 may use conventional broadcast channels and the PSTN 110 may use conventional point-to-point channel connections. This means that the LAN 102 and the PSTN 110 must use different protocols to send packets of information to devices connected to their respective networks. For example, a broadcast protocol may be used with the LAN 102 to send packets of information to the computer 101, the TSC 104, and the terminal server 106. Further, a point-to-point protocol (PPP) or a serial line Internet protocol (SLIP) may be used with the PSTN 110 to send packets of information to the MU's 112, 116, and 120 and the terminal server 106.

The terminal server 106 is used to link the two different types of networks 102 and 110 together. The terminal server 106 is therefore a computerized device that performs conventional functions of a "gateway" between the LAN 102 and the PSTN 110. Accordingly, the terminal server 106 has multiple I/O ports (not shown) and a computerized switch (not shown) for connecting the ports to the LAN 102 and the PSTN 110.

It was also mentioned that the TSC 104 sends commands to the MU's 112, 116, and 120 and receives measurement data back from the MU's 112, 116, and 120. The TSC 104 must therefore exchange commands and data with the MU's 112, 116, and 120 across the network environments of the LAN 102 and the PSTN 110. This means that point-to-point links through the environment of the PSTN 110 must be created for establishing connections between the TSC 104 and the MU's 112, 116, and 120. It is an important advantage of the present invention that these connections can be established under control of software programmed into the TSC 104.

Figure 2:
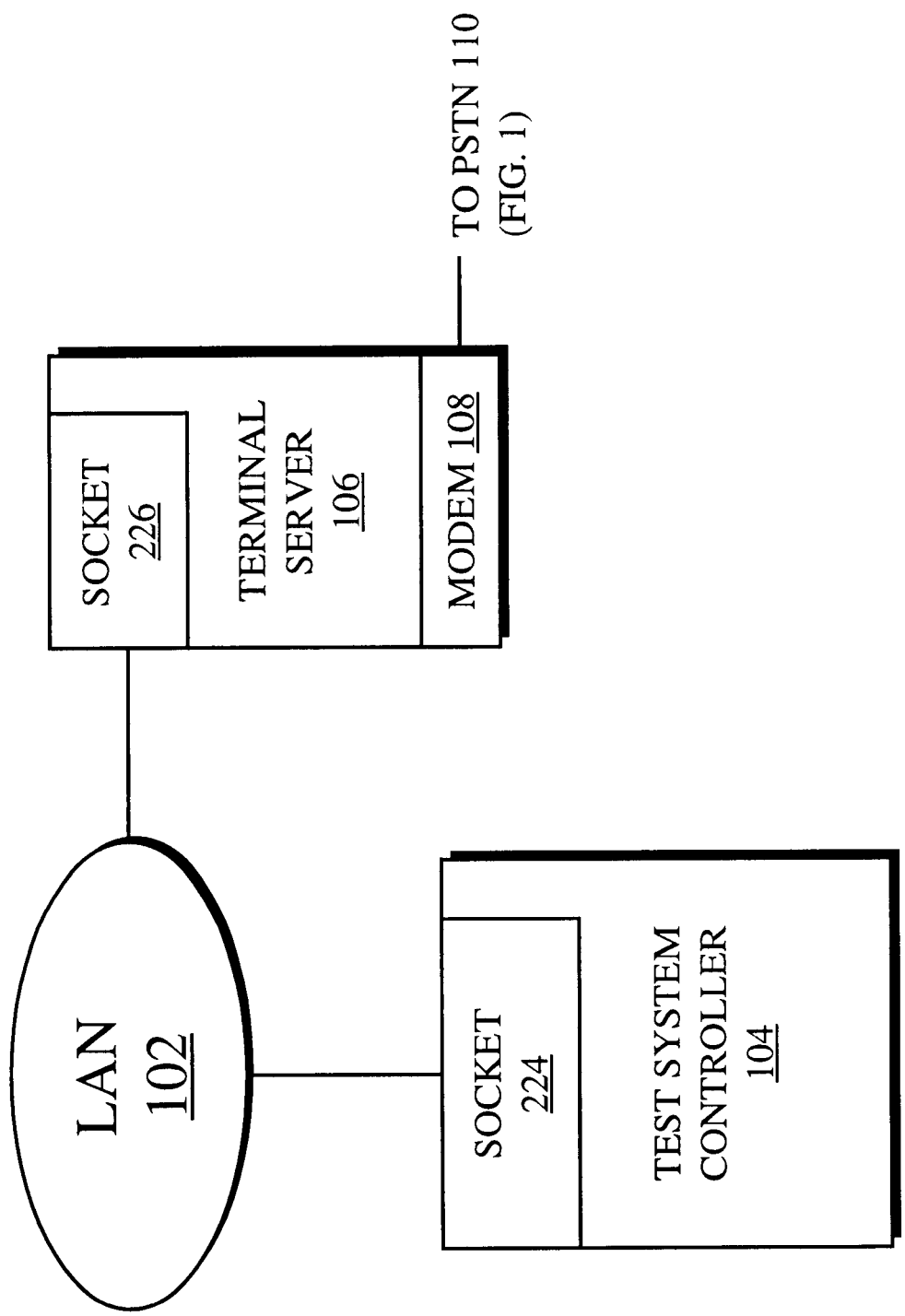
FIG. 2 is a detailed view of a portion of the block diagram shown in FIG. 1, including a partial block diagram of software configurations in a test system controller and a terminal server according to the invention.

FIG. 2 shows a simplified diagram of a communications link through the LAN 102 using a socket interface including sockets 224 and 226. Such a socket interface may generally be a UNIX® file that provides network communications between applications running on different processing systems. In particular, the socket interface including the sockets 224 and 226 is used to open a file over the LAN 102 between the TSC 104 and the terminal server 106, both of which preferably operate under the control of a UNIX® operating system. A file descriptor for the opened file can then be used by applications running on the TSC 104 and the terminal server 106 for sending and receiving data between the applications.

Accordingly, the TSC 104 is programmed with software that creates the socket 224 at a port (not shown) of the TSC 104 and creates the socket 226 at a port (not shown) of the terminal server 106. In the preferred embodiment, the software binds destination addresses for the ports of the TSC 104 and the terminal server 106 to the sockets 224 and 226, respectively. This eliminates the need of supplying the destination addresses each time the socket interface is used to send data between the applications running on the TSC 104 and the terminal server 106. Further, the socket 224 acts like a client socket in that it initiates connections to the terminal server socket 226, thereby allowing the applications running on the TSC 104 and the terminal server 106 to communicate.

Figure 4C:
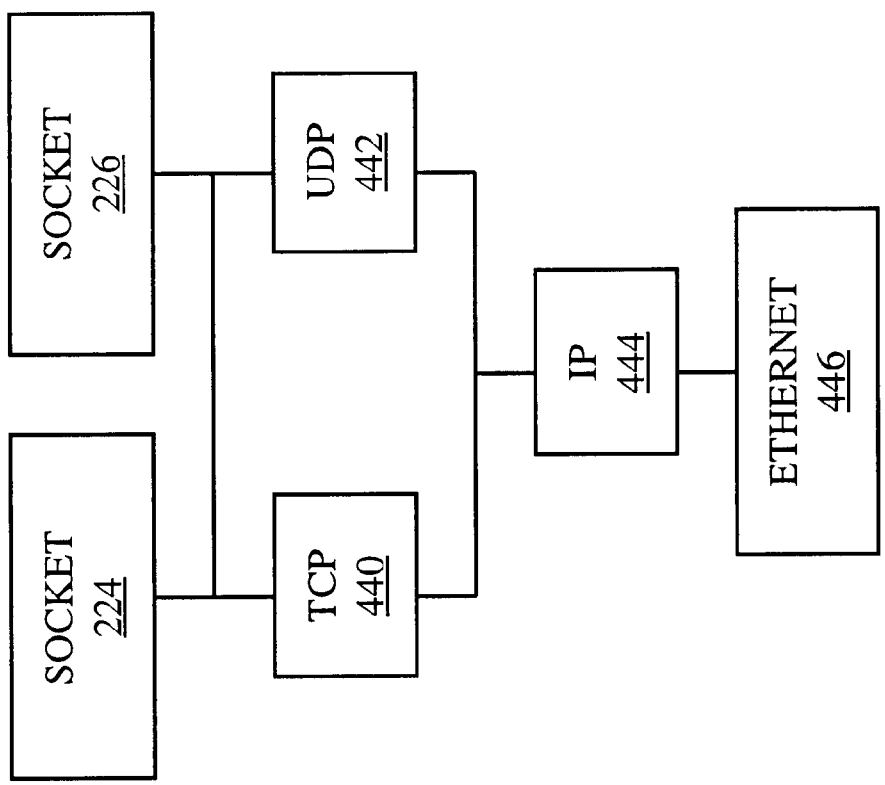

FIG. 4C is a simplified block diagram showing the relationship of protocols used for communicating between the applications running on the TSC 104 and the terminal server 106. In the preferred embodiment, the protocols are based upon the Open Systems Interconnection (OSI) model, which is organized into seven different layers of interrelated protocols including a physical layer, a data link layer, a network layer, a transport layer, a session layer, a presentation layer, and an application layer.

Connections between the socket 224 and the socket 226 utilize the physical layer, the data link layer, the network layer, and the transport layer of the OSI model. For example, the transport layer may include the TCP (Transmission Control Protocol) 440 and the UDP (User Datagram Protocol) 442. The TCP 440 is preferably used to exchange data between the sockets 224 and 226, and the UDP 442 is preferably used for establishing and maintaining communications between the sockets 224 and 226.

Further, the network layer may be the Internet Protocol (IP) 444, and the physical and data link layers may be the LAN protocol, Ethernet 446. Generally, a telecommunication protocol is encapsulated by either TCP/IP or UDP/IP in the transport and network layers, and then transmitted on top of a PPP data link layer via Ethernet using the socket interface. This encapsulation of the TCP/IP or UDP/IP protocols is commonly known as "tunneling." Accordingly, the physical layer, the data link layer, the network layer, and the transport layer of the OSI model are used to complete a connection between the sockets 224 and 226.

Figure 3:
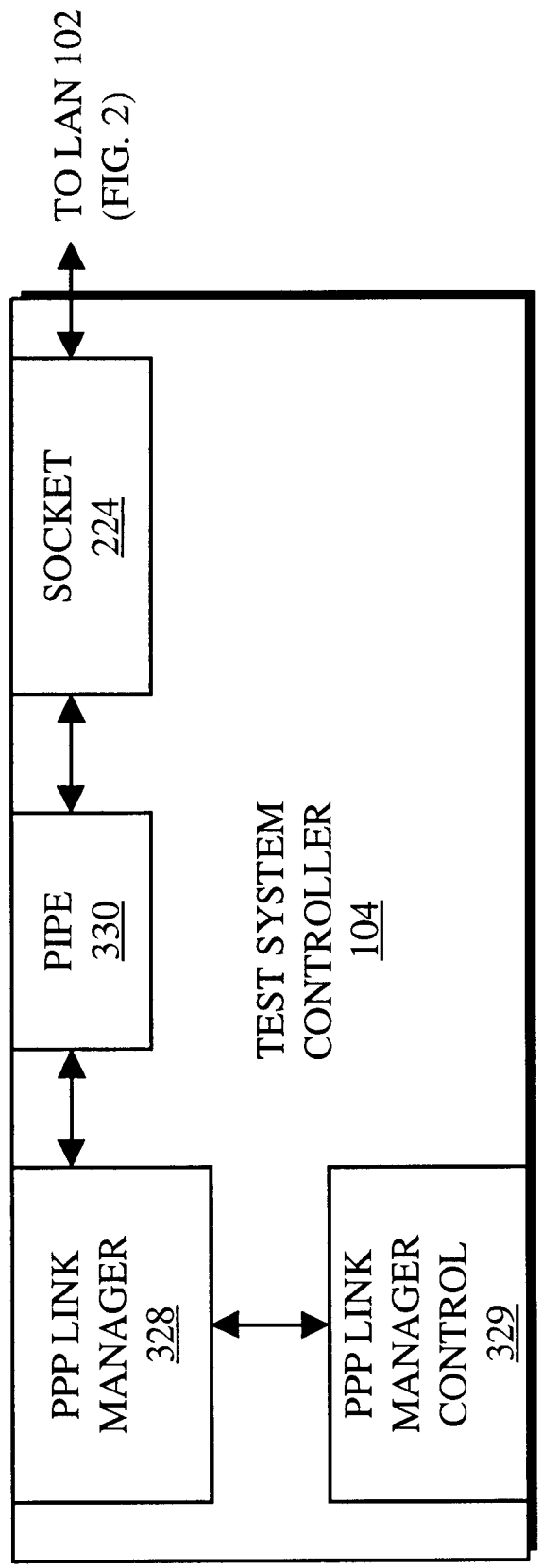
FIG. 3 is a detailed view of the software configuration of the test system controller according to the invention.

FIG. 3 shows the software configuration of the TSC 104 including a PPP link manager 328, a pipe 330, and the socket 224. A PPP link manager generally automates the process of establishing point-to-point connections between computer systems or "peers." Accordingly, the PPP link manager 328 is used to establish point-to-point links between the peer, TSC 104, and the remote peers, MU's 112, 116, and 120.

In the preferred embodiment, the PPP link manager 328 is the native UNIX® PPP link manager, which is a link manager for the asynchronous data link protocol. Further, a PPP link manager control interface 329 is generally used with a UNIX®IP-dialup driver and a UNIX® PPP streams module to establish point-to-point links between peers over a modem and a telephone line. Accordingly, the PPP link manager 328 is used with a dialup driver and a streams module to establish point-to-point links between the TSC 104 and the MU's 112, 116, and 120 over the PSTN 110.

The pipe 330 is preferably a UNIX® pipe utility that creates a communications channel between two processes. In particular, the pipe 330 is used to open two files for reading and writing. File descriptors for the opened files can then be used by the socket process 224 and the PPP link manager 328 for sending and receiving data between the processes.

FIG. 4A is a simplified block diagram showing the relationship of protocols used for communicating between the PPP link manager 328 and the pipe 330. The channel between the PPP link manager 328 and the pipe 330 utilizes the data link layer, the network layer, and the transport layer of the OSI model. For example, the transport layer may include the TCP 432 and the UDP 434. Once again, the TCP 432 is preferably used for communicating data and the UDP 434 is used for all other communications between the PPP link manager 328 and the pipe 330.

Further, the network layer may be the IP 431, and the data link layer is the PPP 433. In this way, TCP/IP/PPP data packets can be exchanged between the PPP link manager 328 and the pipe 330.

Similarly, FIG. 4B is a simplified block diagram showing the relationship of protocols used for communicating between the pipe 330 and the socket process 224. This communications channel also uses TCP 436 and UDP 438 in the transport layer, IP 435 in the network layer, and PPP 437 in the data link layer. In this way, TCP/IP/PPP data packets can be exchanged between the pipe 330 and the socket 224.

It was described earlier TCP/IP/ETHERNET data packets are exchanged between the TSC 104 and the terminal server 106. The terminal server 106 can then use conventional methods to exchange TCP/IP/PPP data packets with selected ones of the MU's 112, 116, and 120 over point-to-point links through the PSTN 110. Accordingly, communication links can be established between the TSC 104 and the MU's 112, 116, and 120 even though the TSC 104 is in a broadcast network and the MU's 112, 116, and 120 are in a point-to-point network.

These communication links between the TSC 104 and the MU's 112, 116, and 120 may conceptually be regarded as "virtual point-to-point links." This is because they function like point-to-point links from the views of the TSC 104 and the MU's 112, 116, and 120. However, they are not actual point-to-point links because they encompass not only a point-to-point network such as the PSTN 110 but also a broadcast network such as the LAN 102.

Similarly, a plurality of virtual point-to-point links between the TSC 104 and the MU's 112, 116, and 120 may conceptually be viewed as a "virtual point-to-point data switch" between the TSC peer and the remote MU peers. In this case, multiple sockets (not shown) may be created at different ports (not shown) of the terminal server 106, and destination addresses for the different ports may be bound to the multiple sockets. In this way, the socket 224 at the TSC peer may initiate connections to selected ones of the multiple sockets at the terminal server 106, thereby allowing the TSC peer to exchange data with the remote MU peers. This conceptualization as a "virtual point-to-point data switch" illustrates the ease at which communications can be established between the TSC peer and the remote MU peers when the TSC peer is programmed as described herein.

Figure 5:
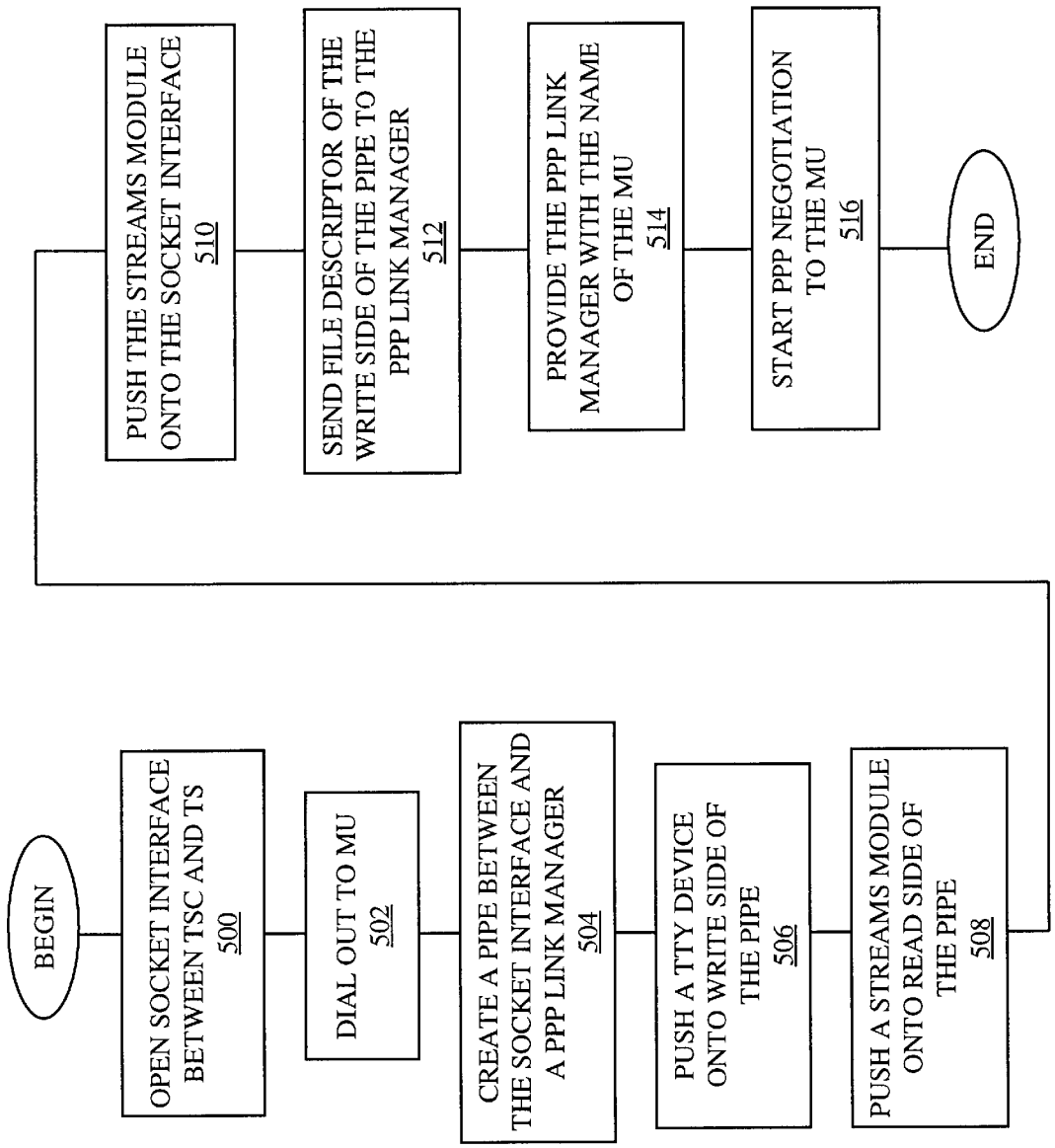
FIG. 5 is a flow diagram showing a method for establishing communication between the test system controller in a LAN and a remote measurement unit in a WAN according to the invention.

A preferred method of establishing a virtual point-to-point link between the TSC 104 and one of the MU's 112, 116, and 120 is implemented according to the procedure shown in FIG. 5, which is meant to be performed under the control of a software application programmed on the TSC 104.

First, a socket interface is opened in block 500 between a first peer in a LAN (preferably the TSC 104 in the LAN 102) and a gateway between the LAN and a WAN (preferably the terminal server 106, which links the LAN 102 and the PSTN 110). In particular, the client socket 224 is created at a port of the TSC 104, and the server socket 226 is created at a port of the terminal server 106. It was mentioned that the destination addresses for the ports of the TSC 104 and the terminal server 106 are preferably bound to the sockets 224 and 226, respectively. The client socket 224 can therefore connect to the server socket 226, thereby allowing data to be passed across the socket interface. This data is preferably passed as TCP/IP/ETHERNET data packets.

Next, a dial-up connection is made in block 502 between the first peer in the LAN and a second peer in the WAN (preferably, one of the MU's 112, 116, and 120 connected to the PSTN 110). In particular, the second peer is a MU connected to the port of the terminal server 106 corresponding to the server socket 226. Further, a UNIX® IP-dialup driver, the terminal server modem 108, and a modem 114, 118, or 122 corresponding to the second peer are used to establish the dial-up connection between the first peer and the second peer.

A pipe is then created in block 504 between the socket interface and a PPP link manager for enabling communication between the socket interface and the PPP link manager, which is preferably the native UNIX® link manager for the asynchronous data link protocol.

Further, a TTY device is pushed onto the "write side" of the pipe interface in block 506 and a streams module is pushed onto the "read side" of the pipe interface in block 508 using UNIX® system calls. The same streams module is then pushed onto the socket interface in block 510. It was mentioned that a pipe construct is generally used to open files for reading and writing, and that two processes generally use these files for sending and receiving data between the processes. The pipe interface can therefore be viewed as having a write side that corresponds with the file used for writing data, and a read side that corresponds with the file used for reading data.

Accordingly, when the PPP link manager 328 sends data to the socket interface through the pipe 330, it interfaces with the write side of the pipe 330. Because the PPP link manager 328 is normally used with a serial terminal, the TTY device is pushed onto the write side of the pipe 330, thereby emulating a serial terminal.

It should be noted that the TTY device provides a binary, 8-bit, character-oriented interface between the PPP link manager 328 and the pipe 330. TCP/IP/PPP data packets are therefore exchanged between the PPP link manager 328 and the pipe 330 across this interface. In this way, 8-bit, asynchronous, flull duplex links are established between the TSC 104 and the MU's 112, 116, and 120.

Further, when the socket interface receives data from the PPP link manager 328, it interfaces with the read side of the pipe 330. Because the socket interface passes data over Ethernet, both the socket interface and the pipe 330 must support IP protocol over Ethernet. The streams module pushed onto the socket interface and the read side of the pipe interface links the IP protocol to Ethernet, thereby allowing the pipe and socket interfaces to communicate.

Next, the file descriptor corresponding to the write file opened by the pipe interface is sent to the PPP link manager in block 512. This allows the PPP link manager 328 to send data to the socket interface through the pipe 330. Further, the name of the second peer in the WAN is provided to the PPP link manager in block 514. In particular, the second peer, which is one of the MU's 112, 116, and 120, has an associated IP address, which is the name that is provided to the PPP link manager 328.

Finally, a point-to-point link is negotiated with the second peer by the PPP link manager in block 516 using conventional techniques. The PPP link manager 328 can therefore establish a point-to-point link between the TSC 104 and one of the MU's 112, 116, and 120.

It should also be noted that the point-to-point link between the TSC 104 and the MU might alternatively be negotiated by the MU. In this case, the MU must first be provided with descriptor of the file opened by the socket interface and the IP address of the TSC 104. Either the PPP link manager 328 or the MU can therefore establish pointto-point links between the TSC 104 and the MU. Most significantly, these point-to-point links can be established in different telecommunication networks using the procedure shown in FIG. 5, without requiring custom software changes in respective gateways.

It follows from the above description that the present invention offers advantages over alternative methods of tunneling PPP data packets over virtual point-to-point links, such as the point-to-point tunneling protocol (PPTP) and the layer two tunneling protocol (L2TP).

For example, the method according to the invention establishes virtual point-to-point links using link management facilities in the TSC or MU client, only. No link management facilities are required on the terminal server. Further, the method presents an 8-bit character-oriented interface to the terminal server. Such considerations are important when the terminal server is a legacy system, such as a gateway in a telecommunication network, because the terminal server does not have to be modified to support such virtual point-to-point links.

In contrast, PPTP and L2TP require link management facilities in both the client and the terminal server. Further, PPTP and L2TP present packet-oriented point-to-point interfaces to the terminal server. This means that legacy systems such as terminal servers would generally have to be modified to support PPTP and L2TP.

Having described one embodiment, alternative embodiments or variations might be made. For example, it was described that the test network 100 included a PSTN 110 and a plurality of MU's 112, 116, and 120. However, this was merely an illustrative example. The test network 100 might alternatively include other types of WAN's, such as X.25 or Frame Relay.

Figure 6:
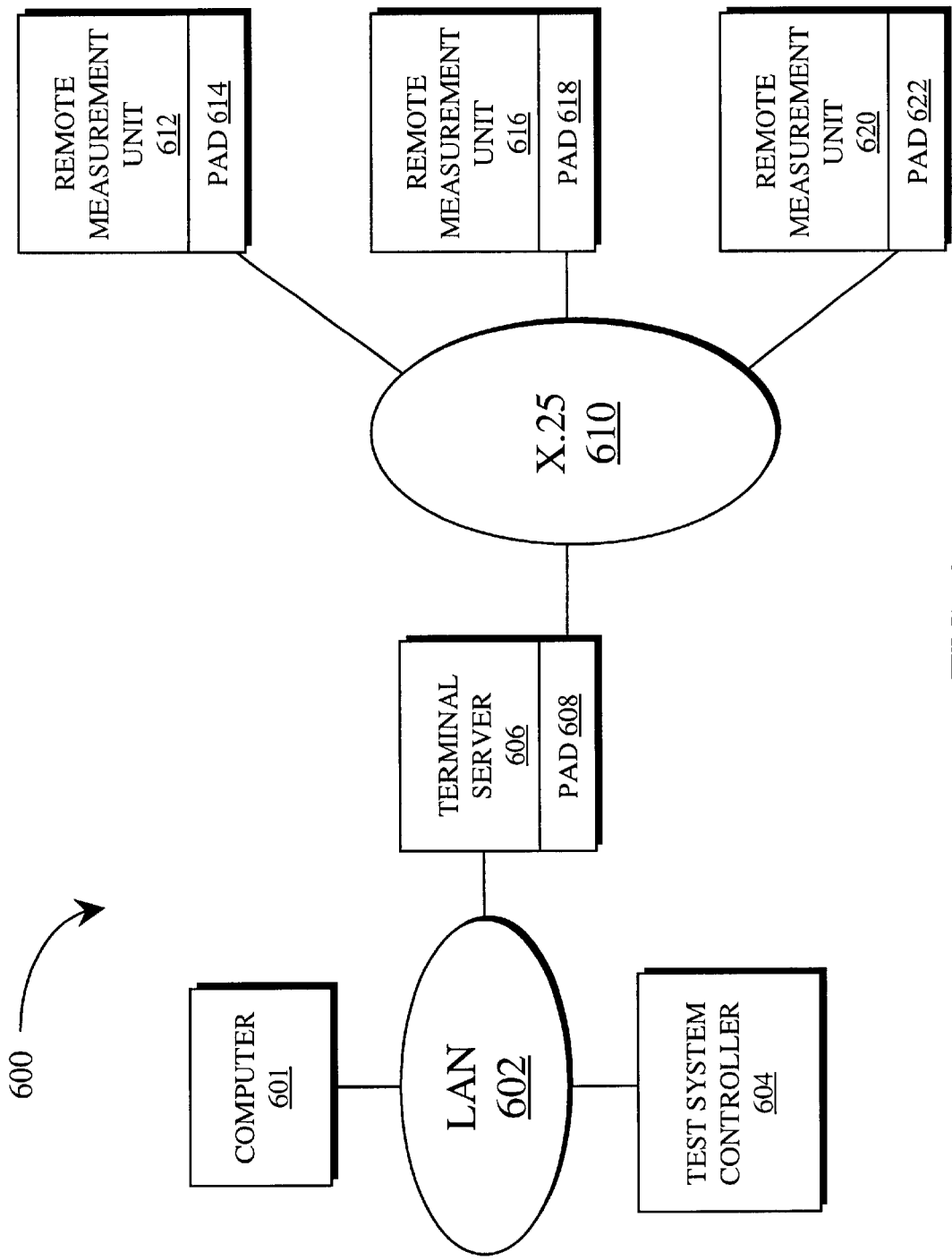
FIG. 6 is an alternate embodiment of a telecommunication network incorporating test system components according to the invention.

For example, FIG. 6 shows a test network 600 that includes an X.25 network 610 and a terminal server 606, which is an X.25 gateway. In order for the MU's 612, 616, and 620 to make connections with the terminal server 606, the MU's 612, 616, and 620 and the terminal server 606 include associated PAD's 614, 618, 622, and 608, respectively.

Further, a virtual point-to-point link between the TSC 604 and one of the MU's 612, 616, and 620 can be implemented using the same general procedure shown in FIG. 5. Specifically, a socket interface can be opened between the TSC 604 and the terminal server 606, a pipe can be created between the socket interface and a PPP link manager programmed on the TSC 604, and PPP links can be negotiated between the MU's 612, 616, 620 and the TSC 604. In this way, TCP/IP or UDP/IP data packets can be exchanged between the TSC 604 and the MU's 612, 616, and 620 across a seamless, asynchronous, full duplex, character-oriented interface. The terminal servers 106 and 606 might even be connected to a common LAN.

Therefore, the invention should be limited only by the spirit and scope of the appended claims.

What is claimed is:

1. A method of establishing a point-to-point connection between a first peer computer in a broadcast network and a remote peer computer in a point-to-point network, the broadcast network and the point-to-point network being linked by a gateway computer, comprising the steps of:

(a) opening a socket interface between the first peer computer and the gateway computer;

(b) creating a pipe between the socket interface and a point-to-point protocol link manager in the first peer computer; and (c) causing the point-to-point protocol link manager to negotiate a point-to-point connection with the remote peer computer.

2. The method as recited in claim 1, wherein the socket interface includes a client socket on the first peer computer and a server socket on the gateway computer.

3. The method as recited in claim 2, wherein the pipe is created for providing a communications link between the client socket and the point-to-point link manager.

4. The method as recited in claim 2, wherein the pipe has a first interface with the client socket and a second interface with the point-to-point protocol link manager, and wherein a TTY device is provided at the first interface and a streams module is provided at the second interface.

5. The method as recited in claim 2, wherein TCP/IP/PPP packets are exchanged between the point-to-point protocol link manager and the client socket and between the gateway computer and the remote peer computer.

6. The method as recited in claim 2, wherein the broadcast network protocol is Ethernet, and wherein TCP/IP/PPP/ETHERNET packets are exchanged between the client socket and the server socket.

7. The method as recited in claim 1, wherein the point-to-point network is a telephone network and the method further includes using the first peer computer to dial-out to the remote peer computer.

8. The method as recited in claim 1, wherein the broadcast network is a local area network, wherein the point-to-point network is a public switched telephone network, wherein the remote peer computer is a measurement unit for measuring parameters relating to the telephone network, and wherein the first peer computer is a test system controller for controlling the operation of the measurement unit and for analyzing the measured parameters.

9. A method of establishing a point-to-point connection between a first peer computer in a broadcast network and a remote peer computer in a point-to-point network, the broadcast network and the point-to-point network being linked by a gateway computer, comprising the steps of:

(a) opening a socket interface between the first peer computer and the gateway computer;

(b) creating a pipe between the socket interface and a point-to-point protocol link manager in the first peer computer; and (c) causing the point-to-point protocol link manager to negotiate a point-to-point connection with the remote peer computer wherein the pipe opens a file for writing and a file for reading and a file descriptor for the file for writing is provided to the point-to-point protocol link manager, wherein the remote peer computer has an IP address and the IP address is provided to the point-to-point protocol link manager, and wherein the point-to-point protocol link manager uses the file descriptor and the IP address for negotiating the point-to-point connection with the remote peer computer.

10. In a computer network of the type having: i) a broadcast network (102); ii) a first computer (104) connected to the broadcast network (102); iii) a point-to-point network (10 ); iv) a gateway (106) connected to the broadcast network and the point-to-point network; and v) a second computer (112, 116, 120) connected over the point-to-point network to a port of the gateway, CHARACTERIZED IN THAT data communication between the first computer and the second computer is performed according to the method of:

a) executing a command on the first computer to establish a socket on the first computer;

b) executing a command on the gateway, thereby establishing a socket on the gateway associated with the port of the gateway;

c) sending data from the first computer, through the socket on the first computer, over the broadcast network to the socket in the gateway.

11. The method of claim 10 wherein the step of sending data comprises:

a) establishing a pipe to the socket on the first computer;

b) using a point to point link manager to exchange data through the pipe.

12. The method of claim 11 wherein the sockets and a pipe are established by executing system calls.

13. The method according to claim 11 wherein the socket on the first computer is a client socket and the socket on the gateway is a server socket.

14. The method of claim 10 wherein the point to point network is the public switched telephone network.

15. The method of claim 10 wherein the broadcast network is an ETHERNET.

16. The method of claim 10 wherein the first computer is a test system controller for testing a telecommunications network and the second computer is a measurement unit attached to the telecommunications network.

17. The method of claim 16 wherein the measurement unit is connected to the point to point network through a modem.

18. The method according to claim 10 wherein point to point communication is established between the first computer and the second computer without using custom communication software on the gateway.

19. The method of claim 10 wherein the sockets are established using UNIX commands.

* * * * *